(12) United States Patent
Ranish et al.

(10) Patent No.: US 7,598,150 B2
(45) Date of Patent: Oct. 6, 2009

(54) COMPENSATION TECHNIQUES FOR SUBSTRATE HEATING PROCESSES

(75) Inventors: Joseph M. Ranish, San Jose, CA (US); Bruce E. Adams, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 320 days.

(21) Appl. No.: 11/561,851

(22) Filed: Nov. 20, 2006

(65) Prior Publication Data

US 2008/0118641 A1    May 22, 2008

(51) Int. Cl.
  *H01L 21/331* (2006.01)
  *A21B 1/00* (2006.01)
  *A21B 2/00* (2006.01)
  *F27D 1/00* (2006.01)

(52) U.S. Cl. .................. 438/378; 219/390; 219/405; 392/418; 432/247

(58) Field of Classification Search ................ 438/378; 219/390, 405; 392/416, 418; 432/247
See application file for complete search history.

(56) References Cited

U.S. PATENT DOCUMENTS

| | | | |
|---|---|---|---|
| 5,848,889 A | 12/1998 | Tietz et al. | |
| 5,978,202 A | 11/1999 | Wadensweiler et al. | |
| 6,034,863 A | 3/2000 | Marohl et al. | |
| 6,122,439 A | 9/2000 | Gronet et al. | |
| 6,123,766 A | 9/2000 | Williams et al. | |
| 6,133,550 A * | 10/2000 | Griffiths et al. | 219/403 |
| 6,200,634 B1 | 3/2001 | Johnsgard et al. | |
| 6,465,761 B2 | 10/2002 | Stevens et al. | |
| 6,759,632 B2 | 7/2004 | Ducret et al. | |
| 6,888,104 B1 | 5/2005 | Ranish et al. | |
| 6,919,538 B2 | 7/2005 | Szekeresch et al. | |
| 7,127,367 B2 | 10/2006 | Ramachandran et al. | |
| 2005/0000449 A1 | 1/2005 | Ishibashi et al. | |
| 2005/0150459 A1 | 7/2005 | Shang et al. | |

* cited by examiner

*Primary Examiner*—Long K Tran
(74) *Attorney, Agent, or Firm*—Moser IP Law Group (57) ABSTRACT

Methods for compensating for a thermal profile in a substrate heating process are provided herein. In one embodiment, a method of processing a substrate includes determining an initial thermal profile of a substrate resulting from a process; imposing a compensatory thermal profile on the substrate based on the initial thermal profile; and performing the process to create a desired thermal profile on the substrate. In other embodiments of the invention, the initial substrate thermal profile is compensated for by adjusting a local mass heated per unit area, a local heat capacity per unit area, or an absorptivity or reflectivity of a component proximate the substrate prior to performing the process. In another embodiment, the heat provided by an edge ring to the substrate may be controlled either prior to or during the substrate heating process.

21 Claims, 5 Drawing Sheets

COMPENSATION TECHNIQUES FOR SUBSTRATE HEATING PROCESSES

BACKGROUND OF THE INVENTION

1. Field of the Invention

Embodiments of the present invention generally relate to substrate processing techniques. More specifically, the present invention relates to processing techniques for creating desired thermal profiles during substrate processing.

2. Description of the Related Art

Rapid thermal processing (RTP) and rapid thermal chemical vapor deposition (RTCVD) annealing processes, and the like (collectively and generically referred to herein as "conventional heating processes"), traditionally use a furnace with infrared radiation generated by halogen lamps to heat a substrate. The substrate, commonly made of silicon, is disposed in a controlled atmosphere enclosure, and the infrared radiation is directed onto the superficial face of the substrate through a transparent window.

The temperatures reached during thermal processing operations may be high, often over 1000° C., with thermal gradients liable to reach several 100° C./second or higher. One important parameter of such substrate processing is the uniformity of the temperature over the entire surface of the processed substrate. The presence of thermal gradients of just a few degrees between the various portions of the substrate can cause defects in the substrate. However, heat loss near the edges of the substrate is much greater than near the center, which leads to lower temperatures at the edge of the substrate.

Several solutions have been proposed to compensate for this temperature inequality. Some examples include: a metal reflector positioned at the rear of the lamps, heating both sides of the substrate with two sets of lamps arranged along opposite sides of the reactor, heating by zones in the reactor, the use of heated susceptors, and fitting an edge ring to minimize heat transfer through the sides of the substrate. However, despite any improvements these solutions may have provided, thermal gradients continue to exist sufficient to cause defects in the substrates.

Therefore, there is a need in the art for a method and apparatus that generates desired substrate thermal profiles when subjected to these heating processes.

SUMMARY OF THE INVENTION

Methods for compensating for a thermal profile in a substrate heating process are provided herein. In one embodiment, a method of processing a substrate includes determining an initial thermal profile of a substrate resulting from a process; imposing a compensatory thermal profile on the substrate based on the initial thermal profile; and performing the process to create a desired thermal profile on the substrate.

In another embodiment, a method of processing a substrate includes determining an initial thermal profile of a substrate resulting from a process; adjusting a local amount of mass heated per unit area of a component proximate the substrate in response to the initial thermal profile; and performing the process to create a desired thermal profile on the substrate.

In another embodiment, a method of processing a substrate includes determining an initial thermal profile of a substrate resulting from a process; adjusting a local heat capacity per unit area of a component proximate the substrate in response to the initial thermal profile; and performing the process to create a desired thermal profile on the substrate.

In another embodiment, a method of processing a substrate includes determining an initial thermal profile of a substrate resulting from a process; controlling the heat provided by an edge ring to the substrate in response to the initial thermal profile; and performing the process to create a desired thermal profile on the substrate.

In another embodiment, a method of processing a substrate includes determining an initial thermal profile of a substrate resulting from a process; adjusting an absorptivity or a reflectivity of a component proximate the substrate in response to the initial thermal profile; and performing the process to create a desired thermal profile on the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

It is to be noted, however, that the appended drawings illustrate only typical embodiments of this invention and are therefore not to be considered limiting of its scope, for the invention may admit to other equally effective embodiments. Where possible, identical reference numerals are used herein to designate identical elements that are common to the figures.

DETAILED DESCRIPTION

The present invention provides methods for processing a substrate utilizing thermal compensation techniques either prior to or during a heating process for creating a desired thermal profile for a substrate during processing.

Figure 1:
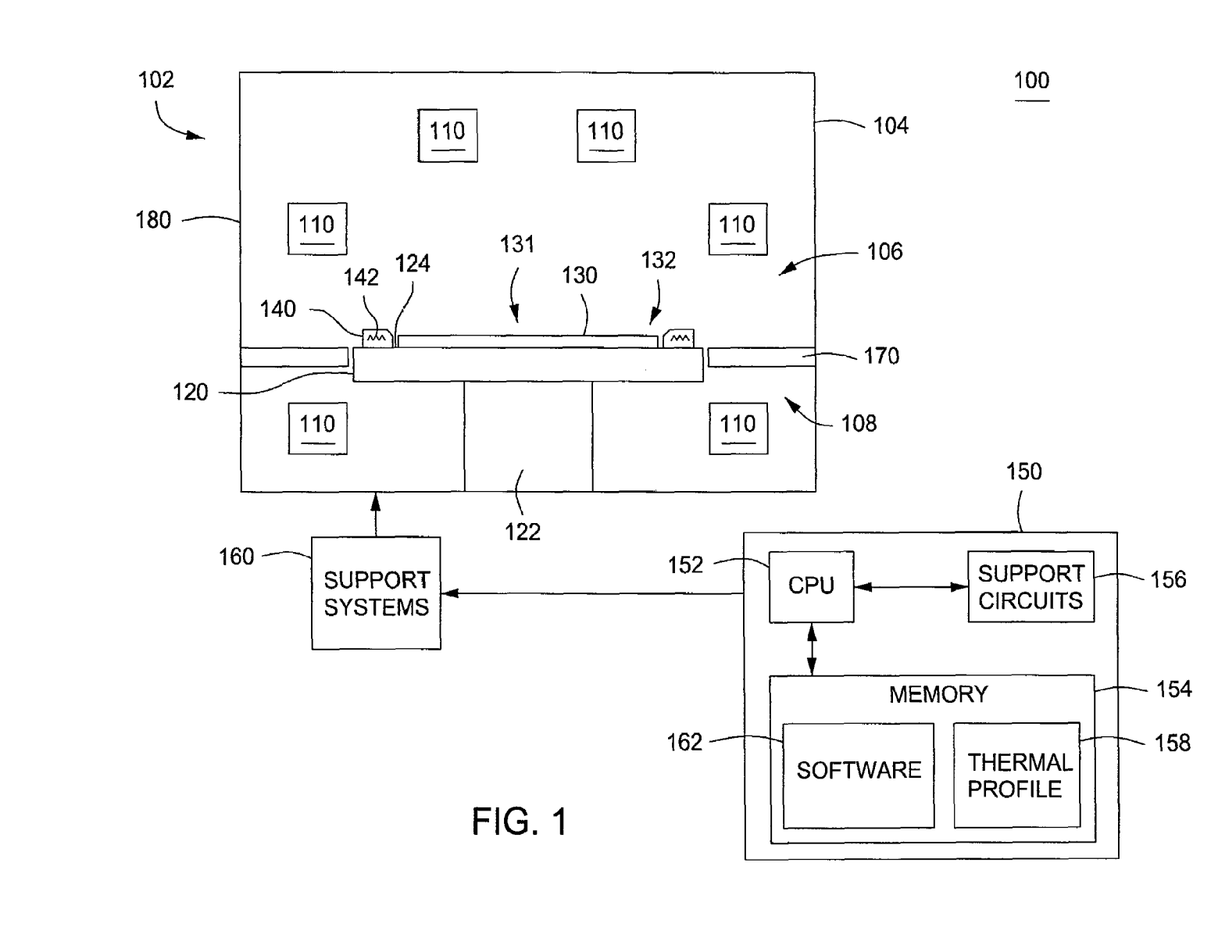
FIG. 1 depicts a schematic, cross-sectional view of a substrate process chamber in accordance with one embodiment of the present invention.

FIG. 1 is a schematic cross-sectional view of a process chamber 100 in accordance with one embodiment of the present invention. The process chamber 100 is suitable for thermally processing substrates 130 such as semiconductor wafers, glass or sapphire substrates, and the like. As used herein, thermally processing refers to any process performed on a substrate in which the temperature of the substrate is controlled. Accordingly, the process chamber 100 may be adapted for performing at least one of deposition processes, etch processes, plasma-enhanced deposition and/or etch processes, and thermal processes, among other processes performed in the manufacture of integrated semiconductor devices and circuits. Specifically, such processes may include, but are not limited to, rapid thermal processes (RTP), rapid thermal chemical vapor deposition (RTCVD), annealing processes (such as flash annealing), and the like In the embodiment depicted in FIG. 1, the process chamber 100 illustratively comprises a chamber body 102, support systems 160, and a controller 150. The chamber body 102 generally includes an enclosure 104 having an upper portion 106, a lower portion 108, and, optionally, a chamber divider 170.

Typically, one or more heat sources 110, a susceptor 120, and a susceptor lift 122 may be disposed within the chamber body 102. The susceptor 120 is configured to support a substrate 130 thereupon. Optionally, an edge ring 140 may be disposed upon the susceptor 120. The edge ring 140 is generally configured to surround the substrate 130 and may optionally include a heating element, such as a resistive heater 142. Optionally, the substrate 130 may be held by the edge ring 140 and the susceptor 120 may be absent.

The heat sources 110 may be disposed at any location throughout the chamber. Typically, the heat sources 110 are disposed in at least one portion of the chamber, for example, the upper portion 106 and/or the lower portion 108 of the chamber body 102, and may be separated by the chamber divider 170. However, some embodiments may provide heat sources 110 on a side 180 of the chamber in addition to or instead of in the upper portion 106 and/or the lower portion 108. Suitable heat sources 110 include heat lamps, hot plates, bottom-radiant devices, infrared (IR) radiation sources, or any other type of heat source suitable for heating the substrate 130.

The susceptor 120, which serves as a support surface for the substrate 130, is disposed on a susceptor lift 122 in the lower portion 108 of the process chamber 100. The susceptor lift 122 may readily raise and lower the susceptor 120 and substrate 130 as desired. The substrate 130 is placed on the susceptor 120 and during a heating process, a temperature distribution is formed across the surface of the substrate 130 by the heat sources 110 (which may vary from a center 131 to an edge 132 of the substrate 130). Depending on the type of process being performed, an edge ring 140 may optionally be used to modify the thermal behavior of the edge (for example, by supplying or removing heat to the substrate edge for higher/lower heating rates, such as by conductively providing/removing heat to or from the substrate edge and/or by reflecting radiation onto the substrate edge or shielding the substrate edge from radiation, or the like).

The support systems 160 of the process chamber 100 include components used to execute and monitor pre-determined processes (e.g., growing epitaxial silicon films) in the process chamber 100. Such components generally include various sub-systems (e.g., gas panel(s), gas distribution conduits, vacuum and exhaust sub-systems, and the like) and devices (e.g., power supplies, process control instruments, and the like) of the process chamber 100. These components are well known to those skilled in the art and are omitted from the drawings for clarity.

The controller 150 generally comprises a central processing unit (CPU) 152, a memory 154, and support circuits 156 and is coupled to and controls the process chamber 100 and support systems 160, directly (as shown in FIG. 1) or, alternatively, via computers associated with the process chamber 100 and/or the support systems 160. In one embodiment, a software routine 162 is disposed in the memory 154, which, when executed, implements compensation techniques for an initial thermal profile 158, discussed below.

Figure 2:
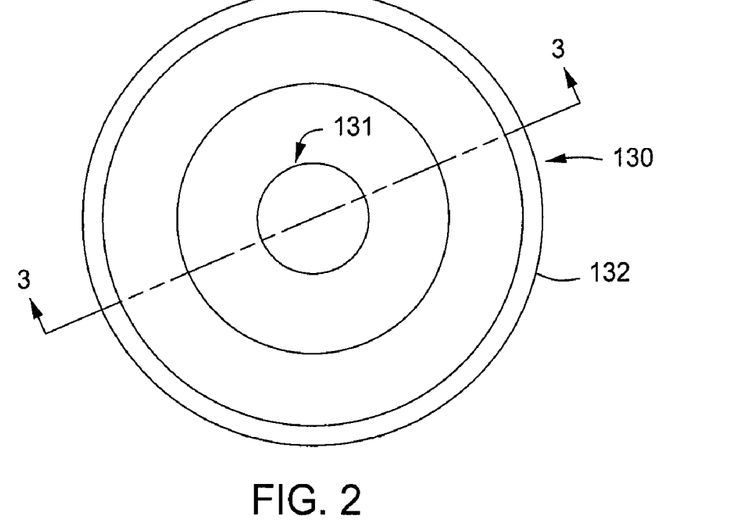
FIG. 2 depicts an illustration of an initial thermal profile of the substrate of FIG. 1.
Figure 3:
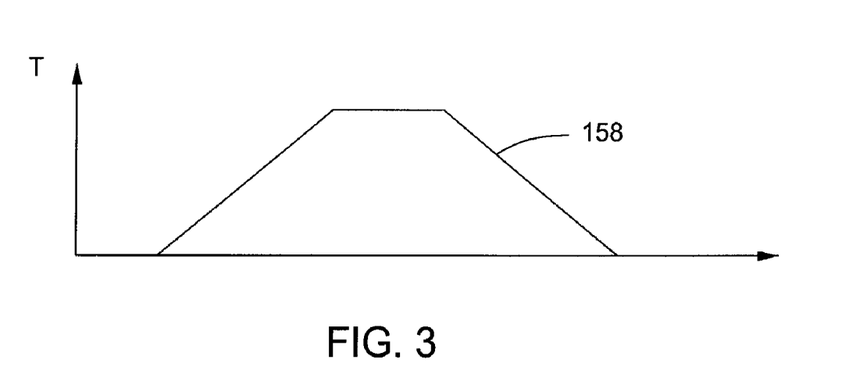
FIG. 3 depicts a graphical representation of the initial thermal profile of the substrate of FIG. 1, along axis 3-3 of FIG. 2.

FIGS. 2 and 3 depict illustrative top and side views, respectively, of an initial thermal profile 158 of a substrate 130. The initial thermal profile 158 typically corresponds to a thermal profile of the substrate 130 immediately or shortly after being subjected to a heating process in a process chamber 100. The thermal profile may be determined by measuring a process result as a function of position on the substrate 130 and converting the process result into temperature differences from knowledge of the process activation energy. The process does not necessarily have to be the same process as the one actually being used in production but can be any well characterized process. For example, a silicon substrate 130 can be subjected to an atmosphere of pure oxygen during a thermal exposure. Afterwards, the silicon dioxide thickness can be used to infer the spatial temperature variation which will be substantially the activation energy weighted temperature distribution during the process. By choosing a characterization process with a very similar activation energy to the production process, the weightings will be approximately the same. Alternately, the weighting can be corrected with knowledge of the respective activation energies.

In one example, the initial thermal profile 158 may generally decrease in temperature concentrically from the center of the substrate 130 due to more rapid heat loss near the edges of the substrate. Accordingly, in the embodiment depicted in FIG. 2, the substrate is hottest near the center 131 and has a declining temperature approaching the edge 132. Although FIGS. 2 and 3 depict an initial thermal profile 158 wherein the center is hotter than the edges, it is contemplated that some processes may result in different thermal profiles, including those with cooler center portions of the substrate 130.

Figure 4:
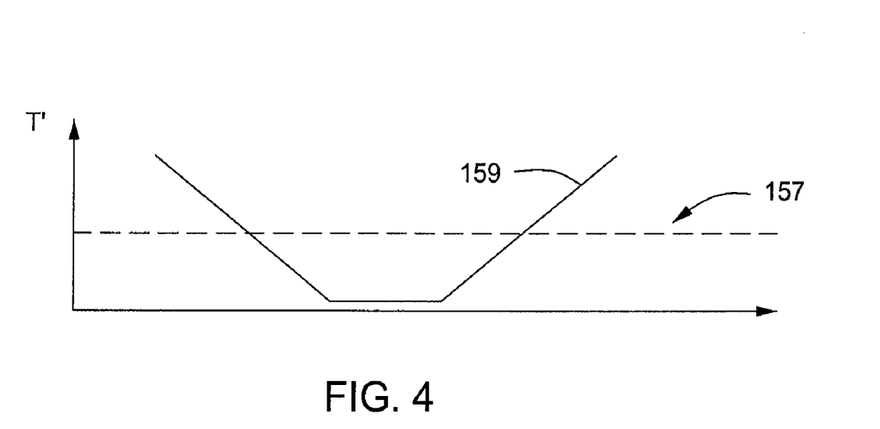
FIG. 4 depicts a graphical representation of a compensatory thermal profile used to compensate for the initial thermal profile of FIGS. 2 and 3 in accordance with one embodiment of the invention.

FIG. 4 depicts a graphical representation of a compensatory thermal profile 159 designed to compensate for the initial thermal profile 158 of FIG. 3, in accordance with one embodiment of the present invention. The compensatory thermal profile 159 is a thermal profile that, when added to the initial thermal profile 158, yields a desired thermal profile 157 for the substrate 130. For example, where a desired thermal profile 157 is a uniform thermal profile (i.e., a substantially flat profile), the compensatory thermal profile 159 is the mathematical inverse of the initial thermal profile 158. Thus, if the two profiles were superimposed upon one another, a graphical representation would appear as a straight line (e.g., thermal profile 157 in FIG. 4). So long as an initial thermal profile 158 and a desired thermal profile 157 are known, or can be determined, a compensatory thermal profile 159 can be found by subtracting the initial thermal profile 158 from the desired thermal profile 157. Consequently, the compensatory thermal profile 159 is sought to be imposed on a substrate 130 according to embodiments of the present invention, as discussed in more detail below.

Figure 5:
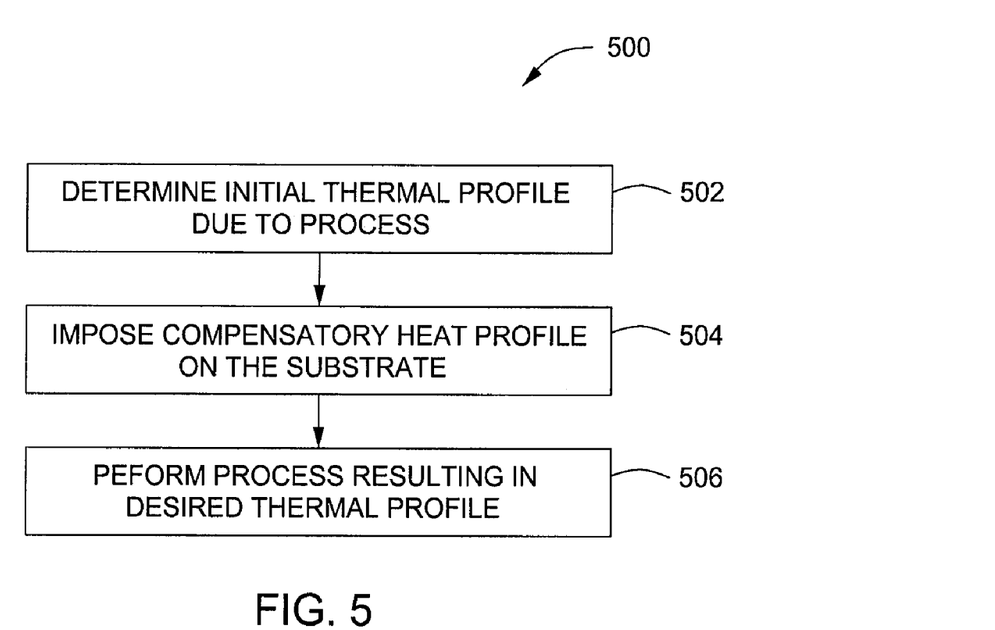
FIG. 5 depicts a flowchart of one embodiment of a method for creating a desired thermal profile for a substrate.

FIG. 5 depicts a flowchart of one embodiment of a method 500 for utilizing compensation techniques for creating a desired thermal profile 157 on a substrate 130 during a heating process. The method 500 is described with reference to FIGS. 1 through 4. The method 500 starts at step 502, where the initial thermal profile 158 of the substrate caused by a heating process is determined. Different methods may be used to determine the initial thermal profile 158 of the substrate 130, including without limitation empirical or experimental testing, computer-based modeling, mathematical modeling, and the like. During empirical or experimental testing, thermal profilers (such as thermocouples, optical pyrometers, radiation pyrometers or the like) may be used to determine the initial thermal profile 158.

At step 504, the initial thermal profile 158 obtained in step 502 is compensated for by imposing a compensatory thermal profile 159 on the substrate 130. In one embodiment, imposing a compensatory thermal profile 159 involves pre-heating the substrate 130 in accordance with the compensatory thermal profile 159. For example, if the desired thermal profile 157 is uniform, areas of the substrate 130 which would normally maintain lower temperatures after a conventional heating process are pre-heated to a temperature greater than areas which normally maintain higher temperatures. The imposition of a compensatory thermal profile 159 may also involve shielding, or protecting particular areas of the substrate from undesired heat transfer. This embodiment provides for the ability to achieve a desired thermal profile 157 without adjusting the heating process for each substrate 130 processed. The substrate 130 may be pre-heated in the process chamber 100 or prior to being introduced into the process chamber 100.

At step 506, the substrate heating process is performed. By having implemented the compensatory thermal profile 159 at step 504, heating the substrate 130 no longer yields the initial thermal profile 158, but rather the desired thermal profile 157. For example, during a flash annealing process with a particular support/substrate geometry, it may be determined that an initial thermal profile 158 may be hotter near the center of the substrate 130 and cooler near the edge of the substrate 130. Accordingly, in embodiments where a substantially uniform thermal profile is desired, the substrate 130 may be pre-heated to impose a compensatory thermal profile 159 on the substrate that corresponds to the inverse of the initial thermal profile 158. As such, when the flash annealing process is performed on the substrate, a substantially uniform thermal profile results, instead of the non-uniform, initial thermal profile 158. Although one thermal profile is illustratively described above, it is contemplated that any thermal profile may be compensated for using the techniques described herein.

In one embodiment, step 506 may be performed immediately after imposing the compensatory thermal profile 159 on the substrate 130 in step 504. Alternatively, step 506 may be performed after a period of time elapses. Optionally, the compensatory thermal profile may further compensate for cooling of the substrate during any period of time between the imposition of the compensatory thermal profile and the performance of the thermal process. For example, if the compensatory thermal profile is imposed in a chamber remote from the processing chamber where the thermal process occurs, the compensatory thermal profile may compensate for the cooling that occurs during the time to transport the substrate to the process chamber where the thermal process is to be performed.

Figure 6:
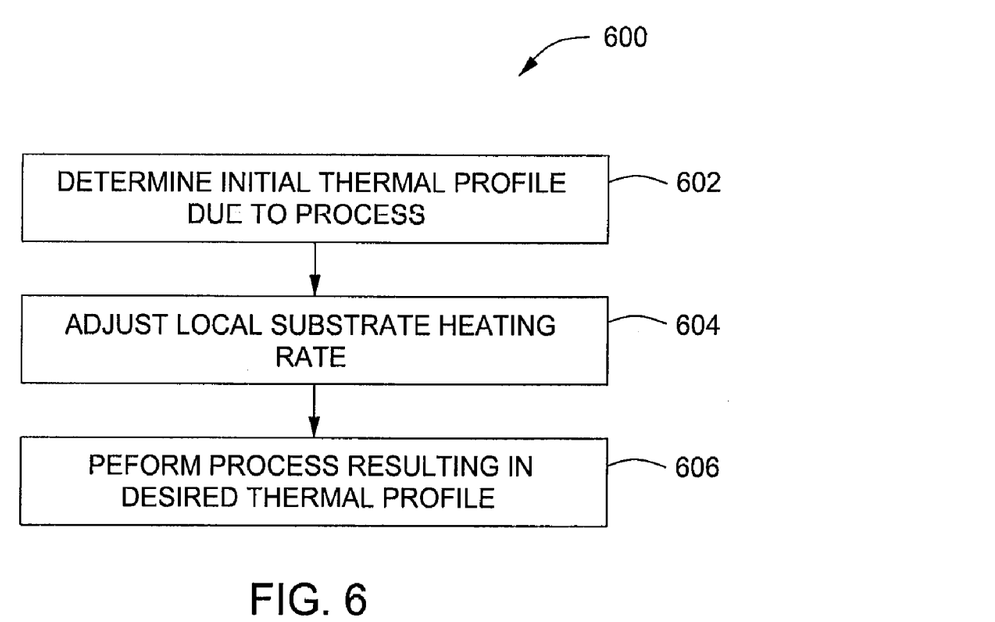
FIG. 6 depicts a flowchart of one embodiment of a method for creating a desired thermal profile for a substrate.

FIG. 6 depicts a flowchart of another embodiment of a method 600 for utilizing compensation techniques for creating a desired thermal profile for a substrate 130. The method 600 is described with reference to FIGS. 1 through 4. The method 600 begins at step 602 where the initial thermal profile 158 of the substrate due to a process is determined. This step is similar to step 502 described above with respect to FIG. 5.

Figure 7:
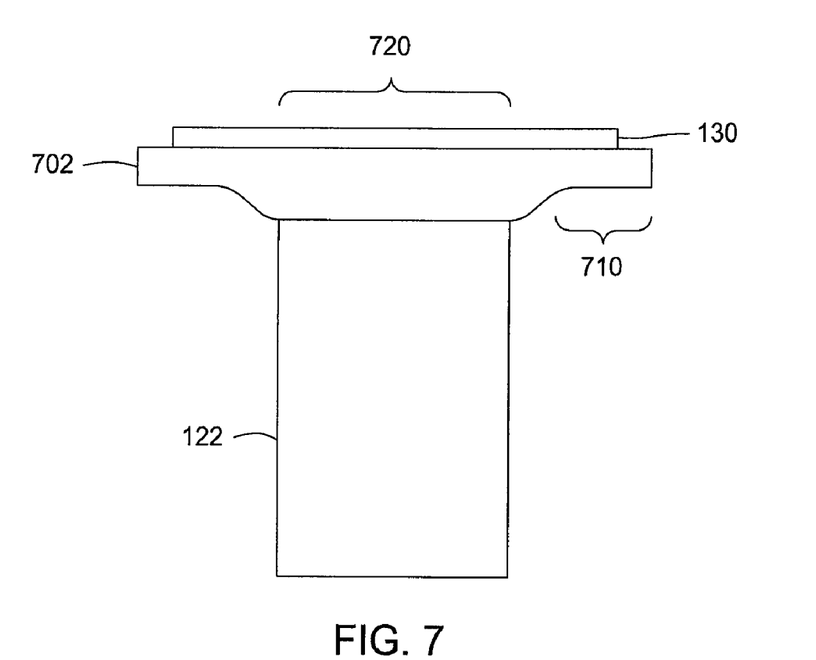
FIG. 7 depicts a schematic, cross-sectional view of a susceptor in accordance with one embodiment of the present invention.

Next, at step 604, a local substrate heating rate adjusted to compensate for the initial thermal profile and result in a desired thermal profile. The local substrate heating rate may be adjusted in a number of ways. In one embodiment, useful for processes which have not reached steady state, the amount of mass heated per unit area may be adjusted, or locally controlled. For example, in the embodiment depicted in FIG. 7, the thickness of a susceptor 702 is varied to emulate the compensatory thermal profile 159, resulting in a change of mass at particular areas of the susceptor 702 (i.e., creating a susceptor having a compensatory heat transfer profile). By varying the thickness of the susceptor 120, thermal properties such as heat flux, heat transfer rates, and the like, which are dependant upon the mass of the susceptor at a particular location, may be controlled. For example, if the susceptor 702 is thicker at a particular location, the heat transfer through that location is decreased by virtue of having more mass to heat, and conversely, if the susceptor 702 is thinner at a particular location, the heat transfer through that location is increased. In the illustrative embodiment depicted in FIG. 7, the susceptor 702 has a thinner section 710 disposed proximate the periphery of a substrate 130, and thicker section 720 proximate the center of the substrate 130 to compensate for an initial heat profile determined to have a hotter center and a cooler edge. It is contemplated that other thickness profiles of susceptors resulting in varying profiles of mass heated per unit area may be utilized to compensate for particular initial thermal profiles determined for particular substrates undergoing particular thermal processes. Alternatively or in combination, the local mass heated per unit area may be controlled via control of the thermal conductivity in desired locations of the susceptor. For example, different regions of the susceptor may have different thermal conductivity to emulate regions of differing mass, as discussed above. Although described as being useful for processes which have not reached steady state, the above techniques may have effects that persist into the steady state regions of a process.

Figure 8:
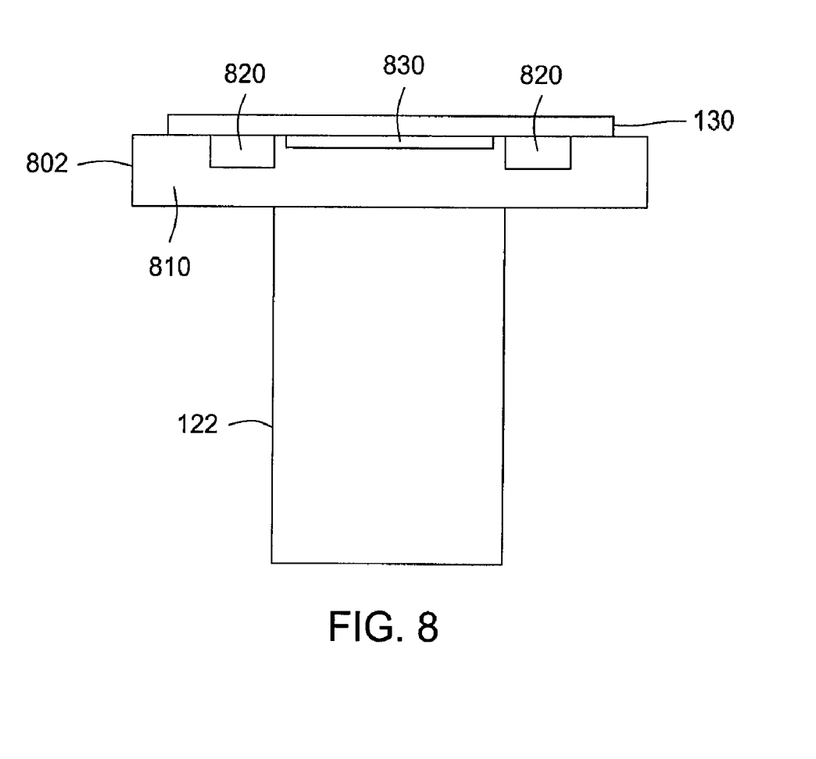
FIG. 8 depicts a schematic, cross-sectional view of a susceptor in accordance with one embodiment of the present invention.

Alternatively or in combination, the local heat capacity per unit per unit area may be adjusted, or locally controlled. For example, in the embodiment depicted in FIG. 8, a multi-material susceptor 802 is utilized, in which material variations in the susceptor 802 change the local heat capacity per unit area to emulate the compensatory thermal profile 159, resulting in a susceptor 802 having a compensatory heat transfer profile. By varying the material selection of the susceptor 802, the local substrate heating rate may be controlled. The material selection may be based on the heat transfer rate of the material. For example, materials with high heat capacity have lower heat transfer rates. Conversely, materials having low heat capacity have higher heat transfer rates. In embodiments where an edge ring is utilized (as depicted in FIG. 1), the material of the edge ring may similarly be selected to have a desired heat rate to compensate for the initial thermal profile of the substrate. In the illustrative embodiment depicted in FIG. 8, the susceptor 802 may comprise a first material 810 with deposits of a second material 820 and a third material 830 where changes in the local heat capacity per unit area are desired to control the local heating rates of the substrate 130 in those areas as a result of a particular thermal process. The heat transfer rates of the first, second, and third materials may be selected to control the local heat capacity per unit area as desired to compensate for the initial thermal profile and result in a desired thermal profile. It is contemplated that the location, geometry, numbers of regions, and/or selection of materials may be varied as desired for particular heating applications.

Alternatively or in combination, the absorptivity or reflectivity of an edge ring or susceptor edge may be adjusted to compensate for the initial thermal profile 158. For example, as discussed above with respect to FIG. 1, the material composition, surface properties (i.e., finish, angle, or the like), or thickness of the edge ring 140 or susceptor edge 124, may be adjusted to control the level of absorptivity or reflectivity as desired. Optical coatings or films, including dielectric film stacks, can also be used to alter the surface properties. As the local absorptivity is increased, more irradiation is retained by the edge ring 140 or susceptor edge 124, and the temperature increases at the substrate edge 132. Conversely, increasing the local reflectivity causes more irradiation to reflect from the edge ring 140 or susceptor edge 124, resulting in a temperature decrease at the substrate edge 132. In another embodiment, an edge ring 140 may be provided with an optional feature (not shown) to reflect additional energy to the substrate edge 132 to heat the substrate edge 132.

Returning to FIG. 6, at step 606, the thermal process is performed resulting in a desired thermal profile formed on the substrate. Thus, by instituting one or more of the above techniques (i.e., varying the mass heated per unit area, varying the heat capacity per unit area, or controlling the absorptivity or reflectivity of the edge ring or susceptor edge), the heating rate of the substrate may be locally controlled, and thereby compensate for an initial thermal profile to yield a desired thermal profile. The effectiveness of the adjustments of mass heated per unit area generally decreases as the heat rate increases (i.e., as the heat rate increases, the amount of mass heated-per-unit area becomes less of a factor in determining the resulting thermal profile of a substrate). For Example, at exceedingly high heating rates like laser surface heating, where the irradiance on the heated piece is on the order of $\sim 1 \times 10^9$ W/m$^2$, only the layers exposed to the radiation (those nearest the surface for visible radiation on bare silicon) are effectively heated. Layers of substrate a couple hundred microns below the surface remain at the starting temperature. In this case, the thermal properties of the substrate support (mass, heat capacity, and the like) are immaterial. The heated thickness depends on the balance of radiation applied and heat dissipated conductively in the substrate. Therefore, although the method described above with respect to FIG. 6 may be utilized in any thermal process, it is particularly useful for low-heat processes (i.e., processes with heat rates on the order of hundreds of degrees Celsius per second).

Figure 9:
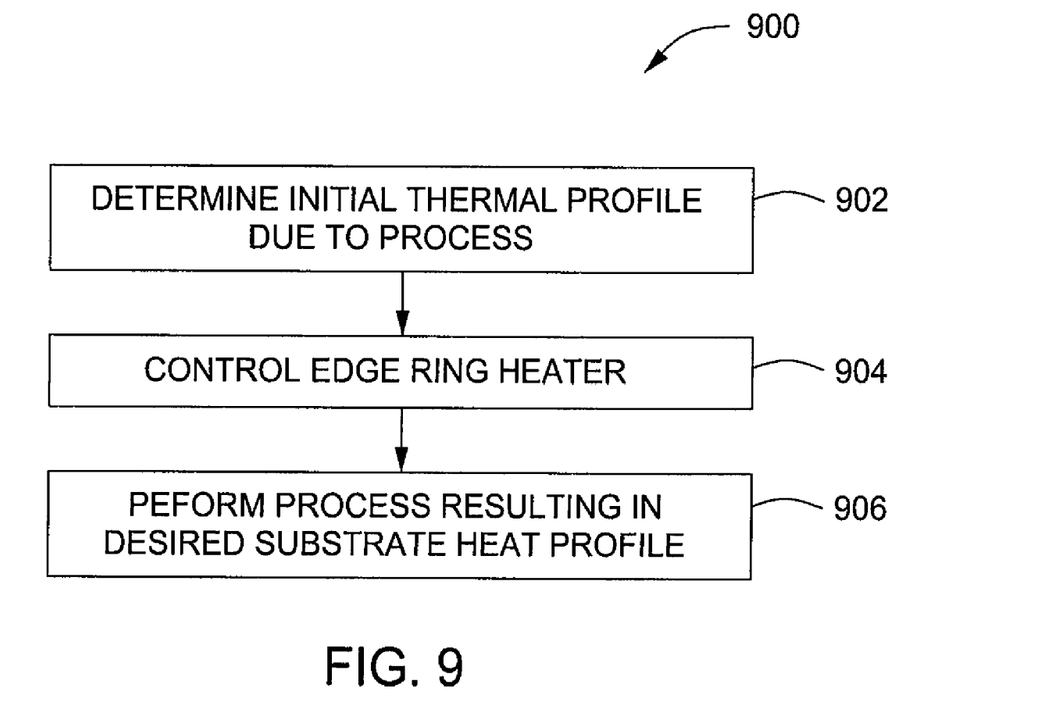
FIG. 9 depicts a flowchart of one embodiment of a method for creating a desired thermal profile for a substrate.

FIG. 9 depicts a flowchart of yet another embodiment of a method 900 for utilizing compensation techniques for creating a uniform thermal profile on a substrate. The method 900 is discussed with reference to FIG. 1. The method 900 begins at step 902 where an initial thermal profile of a substrate due to a process is determined, similar to steps 502 and 602, discussed above with respect to FIGS. 5 and 6, respectively.

Next, at step 904, a heater disposed within the edge ring 140 (such as resistive heater 142) is controlled to heat the substrate in a manner that compensates for the initial thermal profile of the substrate and yields a desired thermal profile. The heater may be controlled manually or via the controller 150.

The average temperature of the edge ring 140 may be inferred by monitoring the electrical resistance of the resistive heater 142. As such, the current supplied to the heater 142 may be controlled to produce a temperature of the edge ring 142 that compensates for the initial thermal profile. For example, in embodiments where the initial thermal profile of the substrate has a cooler edge (such as depicted in FIGS. 2 and 3) the temperature of the edge ring 140 may be increased to reduce the more rapid heat loss near the edge of the substrate and provide the desired thermal profile. In other embodiments, the temperature of the heater 142 may be kept at a lower temperature to prevent excessive heating of the edge of the substrate. Moreover, in embodiments where the edge ring has a negative temperature coefficient, the resistive heating will tend to heat the cooler regions of the edge ring more and even out any non-uniformities in the edge ring temperature.

At step 906, which may be performed subsequent to or simultaneously with step 904, the process is performed, resulting in a substrate with a substantially desired thermal profile.

Thus, embodiments of methods for processing a substrate utilizing thermal compensation techniques for creating a desired thermal profile on a substrate have been provided. The disclosed techniques advantageously compensate for non-desired initial thermal profiles caused by a process and provide for the creation of a desired thermal profile on a substrate.

While the foregoing is directed to embodiments of the present invention, other and further embodiments of the invention may be devised without departing from the basic scope thereof, and the scope thereof is determined by the claims that follow.

The invention claimed is:

1. A method of processing a substrate, comprising:
    determining an initial thermal profile of a substrate resulting from a process;
    imposing a compensatory thermal profile on the substrate prior to performing the process on the substrate based on the initial thermal profile; and
    performing the process to create a desired thermal profile on the substrate.

2. The method of claim 1, wherein the step of imposing a compensatory thermal profile on the substrate comprises:
    pre-heating the substrate to establish the compensatory thermal profile.

3. The method of claim 2, wherein the compensatory thermal profile is the inverse of the initial thermal profile.

4. The method of claim 2, wherein the pre-heating step is performed outside of a chamber where the process is to be performed.

5. The method of claim 2, wherein the pre-heating step is performed in the same chamber where the process is to be performed.

6. The method of claim 1, wherein the process comprises one of a rapid thermal process, a rapid thermal chemical vapor deposition process, or an annealing process.

7. The method of claim 1, wherein the process comprises a flash annealing process.

8. The method of claim 1, wherein the desired thermal profile is substantially uniform.

9. A method of processing a substrate, comprising:
    determining an initial thermal profile of a substrate resulting from a process;
    adjusting a local amount of mass heated per unit area of a component proximate the substrate in response to the initial thermal profile; and
    performing the process to create a desired thermal profile on the substrate.

10. The method of claim 9, wherein adjusting the local amount of mass heated per unit area comprises:
    varying the thickness of regions of a susceptor for supporting the substrate in response to the initial thermal profile.

11. The method of claim 9, wherein adjusting the local amount of mass heated per unit area comprises:
    varying the thermal conductivity of regions of a susceptor for supporting the substrate in response to the initial thermal profile.

12. A method of processing a substrate, comprising:
    determining an initial thermal profile of a substrate resulting from a process;
    adjusting a local heat capacity per unit area of a component proximate the substrate in response to the initial thermal profile; and
    performing the process to create a desired thermal profile on the substrate.

13. The method of claim 12, wherein adjusting the local heat capacity per unit area comprises:
    providing a multi-material susceptor for supporting the substrate, wherein the multi-material susceptor comprises regions of different materials that compensate for the initial thermal profile to produce the desired thermal profile.

14. The method of claim 13, wherein the susceptor comprises at least a first region and a second region proximate the substrate, wherein the first and second regions have different heat capacities.

15. A method of processing a substrate, comprising:
    determining an initial thermal profile of a substrate resulting from a process;
    controlling the heat provided by an edge ring to the substrate in response to the initial thermal profile to pre-heat the substrate; and
    performing the process to create a desired thermal profile on the pre-heated substrate.

16. The method of claim 15, wherein the edge ring comprises a resistive heater.

17. The method of claim 16, wherein the resistance of the edge ring is monitored to determine the temperature of the edge ring.

18. The method of claim 15, further comprising:
    controlling the heat provided by the edge ring to the substrate while performing the process.

19. A method of processing a substrate, comprising:
    determining an initial thermal profile of a substrate resulting from a process;
    adjusting an absorptivity or a reflectivity of a component proximate the substrate in response to the initial thermal profile; and
    performing the process to create a desired thermal profile on the substrate.

20. The method of claim 19, wherein the component is at least one of an edge ring or an edge of a susceptor.

21. The method of claim 19, wherein adjusting of the absorptivity or reflectivity of the component comprises changing at least one of a material composition, a surface property, or a thickness of the component.

* * * * *